(12) United States Patent
Zhang et al.

(10) Patent No.: US 11,954,585 B2
(45) Date of Patent: Apr. 9, 2024

(54) MULTI-MODE ARRAY STRUCTURE AND CHIP FOR IN-MEMORY COMPUTING

(71) Applicant: ZJU-Hangzhou Global Scientific and Technological Innovation Center, Hangzhou (CN)

(72) Inventors: Yishu Zhang, Hangzhou (CN); Hua Wang, Hangzhou (CN); Xuemeng Fan, Hangzhou (CN)

(73) Assignee: ZJU-Hangzhou Global Scientific and Technological Innovation Center, Hangzhou (CN)

( * ) Notice: Subject to any disclaimer, the term of this patent is extended or adjusted under 35 U.S.C. 154(b) by 0 days.

(21) Appl. No.: 18/325,043

(22) Filed: May 29, 2023

(65) Prior Publication Data
US 2023/0306250 A1 Sep. 28, 2023

(30) Foreign Application Priority Data
Oct. 24, 2022 (CN) .......................... 202211300003.8

(51) Int. Cl.
*G06N 3/063* (2023.01)
*G06N 3/0464* (2023.01)
(Continued)

(52) U.S. Cl.
CPC ........... *G06N 3/063* (2013.01); *G06N 3/0464* (2023.01); *G06N 3/049* (2013.01); *G11C 15/04* (2013.01)

(58) Field of Classification Search
CPC ...... G06N 3/063; G06N 3/0464; G06N 3/049; G11C 15/04
See application file for complete search history.

(56) References Cited

U.S. PATENT DOCUMENTS

2015/0254553 A1 9/2015 Arsovski et al.
2023/0162024 A1* 5/2023 Wang .................... G06F 7/5443
706/19

FOREIGN PATENT DOCUMENTS

CN 113178219 A 7/2021
CN 114298296 A 4/2022
(Continued)

OTHER PUBLICATIONS

Halawani et al., "ReRAM-Based In-Memory Computing for Search Engine and Neural Network Applications," in 9.2 IEEE J. Emerging and Selected Topics on Circuits and Sys. 388-97 (2019). (Year: 2019).*

(Continued)

*Primary Examiner* — Ryan C Vaughn
(74) *Attorney, Agent, or Firm* — Zhigang Ma (57) ABSTRACT

The present disclosure relates to the technical field of semiconductor integrated circuits and discloses a multi-mode array structure for in-memory computing, and a chip, including: an array of memory cells, function lines corresponding to all the memory cells measured by rows in the array of memory cells, and complementary function lines and bit lines BL corresponding to all the memory cells measured by columns in the array of memory cells. According to the present disclosure, the TCAM function and CNN and SNN operations are enabled; the multi-mode array for in-memory computing herein goes beyond the limits of the von Neumann architecture by integrating the multiple modes of storage and computation, achieving efficient operation and computation; in addition to solving the computing power problem, a new array mode is provided to promote the development of high-integration circuits.

9 Claims, 7 Drawing Sheets

(51) Int. Cl.
*G06N 3/049* (2023.01)
*G11C 15/04* (2006.01)

(56) References Cited

FOREIGN PATENT DOCUMENTS

CN   114614865 A   6/2022
WO   2012148643 A1   12/2021

OTHER PUBLICATIONS

Zhou et al., "The Trend of Emerging Non-Volatile TCAM for Parallel Search and AI Applications," in 1 Chip 100012 (2022). (Year: 2022).*

Mao et al., "Experimentally Validated Memristive Memory Augmented Neural Network with Efficient Hashing and Similarity Search," in 13 Nature Comms. 6284 (2022). (Year: 2022).*

\* cited by examiner

MULTI-MODE ARRAY STRUCTURE AND CHIP FOR IN-MEMORY COMPUTING

FIELD

The present disclosure relates to the technical field of semiconductor integrated circuits and discloses a multi-mode array structure and chip for in-memory computing, including: an array of memory cells, function lines corresponding to all the memory cells measured by rows in the array of memory cells, and complementary function lines and bit lines BL corresponding to all the memory cells measured by columns in the array of memory cells. According to the present disclosure, the TCAM function and CNN and SNN operations are enabled; the multi-mode array for in-memory computing herein goes beyond the limits of the von Neumann architecture by integrating the multiple modes of storage and computation, achieves efficient operation and computation; in addition to solving the computing power problem, a new array mode is provided to promote the development of high-integration circuits.

BACKGROUND

A fast-growing demand for computing power has been seen in the digital age, but with Moore's law reaching its limit, it is even more difficult to improve the computing power of a chip by increasing its integration level. In this context, diversified computing architectures point out a direction for improving computing performance. Compared with the von Neumann computing architecture in most computers, an in-memory processing architecture performs data storage and computation by means of the resistance value of a memristor and achieves high-level integration in the form of a cross array, hence highly energy-efficient and excellent computation is possible. At present, ternary content addressable memory (TCAM) is applied to address and search in a network node; three logic states, i.e., [0], [1], and [X (arbitrary)], are stored through the resistance value change of memory cell memristors, and a search function is enabled by comparing data input through a search line (SL) with data stored in the TCAM in parallel; a data address is returned through a match line ML when a successful match is detected. Convolutional neural networks (CNN) and spiking neural networks (SNN) are third-generation artificial neural networks, with each array node as a memristor cell. The conductance of each memristor is a weight value, and signal data is input through a word line WL, a brain-like operation is performed on the data through arrays and operated data is output through a bit line BL, but the input and output of the CNN are analogue values, and the input and output of a neuron of the SNN are a single digital pulse. Therefore, for applications such as TCAM, CNN, and SNN, although they are all memristor-based arrays, the computation and operation modes and architectures of the arrays are different, so it is necessary to design a reconfigurable peripheral circuit array that supports the different computation and operation modes of TCAM, CNN, and SNN, so as to obtain a multi-mode array structure for in-memory computing that satisfies the requirements of different application scenarios.

SUMMARY

It is an object of the present disclosure to overcome the problem in the prior art that the TCAM, CNN, and SNN have their own unique modes of computation and operation, which limit the versatility of neuromorphic arrays, by providing a multi-mode array structure for in-memory computing, and a chip.

To achieve the above object, the present disclosure provides a multi-mode array structure for in-memory computing, including: an array of memory cells, function lines corresponding to all the memory cells measured by rows in the array of memory cells, and complementary function lines and bit lines BL corresponding to all the memory cells measured by columns in the array of memory cells, where the memory cell is configured to match a search state of a search signal input from a corresponding complementary function line with a stored data bit in the memory cell, and output a matching result to the corresponding function line, thereby enabling a TCAM function;

the memory cell is configured to calculate an analogue signal or a pulse signal input from a corresponding function line with a neural network weight value set in the memory cell, and output a calculation result to a corresponding bit line BL, thereby enabling a corresponding CNN or SNN operation.

In an embodiment, the complementary function lines include a first complementary function line and a second complementary function line, third ends of all the memory cells measured by columns in the array of memory cells are connected to one first complementary function line, fourth ends of all the memory cells measured by columns in the array of memory cells are connected to one second complementary function line, and fifth ends of all the memory cells measured by columns in the array of memory cells are connected to one bit line BL, the bit line BL being connected to a ground terminal.

In an embodiment, each memory cell includes a first memristor, a second memristor, a first transistor, a second transistor, and a differential amplifier; a top electrode of the first memristor and a top electrode of the second memristor are connected to the function line; a bottom electrode of the first memristor is connected to a drain electrode of the first transistor; a bottom electrode of the second memristor is connected to a drain electrode of the second transistor; a gate electrode of the first transistor is connected to the third end of the memory cell; a gate electrode of the second transistor is connected to the fourth end of the memory cell; a source electrode of the first transistor is connected to a first input end of the differential amplifier; a source electrode of the second transistor is connected to a second input end of the differential amplifier; and output ends of the differential amplifier are connected to the fifth ends of the memory cells, respectively.

In an embodiment, the first memristor, the second memristor, the first transistor, and the second transistor are prepared through an integrated process, the first memristor is provided on a drain electrode surface of the first transistor, the second memristor is provided on a drain electrode surface of the second transistor, and a shallow trench isolation region is further provided between the first transistor and the second transistor, wherein the process for preparing the first memristor, second memristor, first transistor, and second transistor includes:

forming the shallow trench isolation region, and an n-well region corresponding to the first transistor and a p-well region corresponding to the second transistor, respectively, on both sides of the shallow trench isolation region on the basis of a COMS front-end process; forming a gate electrode, a source electrode, and a drain electrode corresponding to the first transistor on a surface of and inside the n-well region, and forming a gate electrode, a source electrode, and a drain electrode corresponding to the second transistor on a surface of and inside the p-well region, so as to obtain the first transistor and the second transistor;

forming a dielectric layer on surfaces of the first transistor and the second transistor, forming a first contact hole perpendicular to the drain electrode surface of the first transistor and a second contact hole perpendicular to the drain electrode surface of the second transistor, respectively, in a dielectric region through an etching process, depositing a first oxide layer and a second oxide layer, respectively, in the first contact hole and the second contact hole, filling the first contact hole and the second contact hole with a metal filler to form a first metal filler layer on a surface of the first oxide layer and a second metal filler layer on a surface of the second oxide layer, so as to obtain a first memristor positioned on the drain electrode surface of the first transistor and containing the first oxide layer and the first metal filler layer, and a second memristor positioned on the drain electrode surface of the second transistor and containing the second oxide layer and the second metal filler layer;

completing the preparation on the basis of a COMS back-end process.

In an embodiment, the function line has both functions of a match line ML and a word line WL, and both the first complementary function line and the second complementary function line have both the functions of a search line SL and a control line VL.

In an embodiment, when the TCAM function is performed, the differential amplifier is in an off state, a corresponding stored data bit in the memory cell is one of 0, 1, and X, and an input search signal corresponds to a search state of being 0 or 1;

when the stored data bit in the memory cell connected to the corresponding function line in all the memory cells measured by rows is X, an output of the corresponding function line is a high level; alternatively, when the stored data bit in the memory cell connected to the corresponding function line in all the memory cells measured by rows is 0 or 1, and the stored data bit is consistent with the search state corresponding to the search signal, the output of the corresponding function line is the high level; when the data bit, connected to the corresponding function line, stored in at least one memory cell in all the memory cells measured by rows is 0 or 1, and the stored data bit is inconsistent with the search state corresponding to the search signal, the output of the corresponding function line is a low level.

In an embodiment, when the first memristor in the memory cell is set to a high-resistance state and the second memristor is set to a low-resistance state, the corresponding stored data bit is 1; when the first memristor in the memory cell is set to the low-resistance state and the second memristor is set to the high-resistance state, the corresponding stored data bit is 0; when the first memristor in the memory cell is in the high-resistance state and the second memristor is in the high-resistance state, the corresponding stored data bit is X; when the first transistor in the memory cell is controlled in an on state and a second transistor is controlled in an off state, the search state corresponding to an input search signal is 1; when the first transistor in the memory cell is controlled in the off state and the second transistor is controlled in the on state, the search state corresponding to the input search signal is 0;

alternatively, when the first memristor in the memory cell is set to the low-resistance state and the second memristor is set to the high-resistance state, the corresponding stored data bit is 1; when the first memristor in the memory cell is set to the high-resistance state and the second memristor is set to the low-resistance state, the corresponding stored data bit is 0; when the first memristor in the memory cell is set to the high-resistance state and the second memristor is set to the high-resistance state, the corresponding stored data bit is X; when the first transistor in the memory cell is controlled in the off state and the second transistor is controlled in the on state, the search state corresponding to the input search signal is 1; when the first transistor in the memory cell is controlled in the on state and the second transistor is controlled in the off state, the search state corresponding to the input search signal is 0.

In an embodiment, when the CNN or the SNN operation function is performed, the first transistor, the second transistor, and the differential amplifier are all in the on state; the memory cell is configured to calculate the analogue signal or the pulse signal input from the corresponding function line with a neural network positive or negative weight value set in the memory cell, wherein the memory cell realizes the neural network positive or negative weight value by setting a conductance of the first memristor and the second memristor in the memory cell and setting the first input end of the differential amplifier as a positive input end or a negative input end.

In an embodiment, when the conductance of the first memristor in the memory cell is set to be greater than the conductance of the second memristor, and the first memristor is connected to the positive input end of the differential amplifier via the first transistor while the second memristor is connected to the negative input end of the differential amplifier via the second transistor, the analogue signal or the pulse signal is input to the first memristor and the second memristor through the corresponding function line, so as to obtain a weight value corresponding to the memory cell as the positive weight value; when the conductance of the first memristor in the memory cell is set to be less than the conductance of the second memristor, and the first memristor is connected to the positive input end of the differential amplifier via the first transistor while the second memristor is connected to the negative input end of the differential amplifier via the second transistor, the analogue signal or the pulse signal is input to the first memristor and the second memristor through the corresponding function line, so as to obtain a weight value corresponding to the memory cell as the negative weight value;

when the conductance of the first memristor in the memory cell is set to be greater than the conductance of the second memristor, and the first memristor is connected to the negative input end of the differential amplifier via the first transistor while the second memristor is connected to the positive input end of the differential amplifier via the second transistor, the analogue signal or the pulse signal is input to the first memristor and the second memristor through the corresponding function line, so as to obtain a weight value corresponding to the memory cell as the negative weight value; when the conductance of the first memristor in the memory cell is set to be less than the conductance of the second memristor, and the first memristor is connected to the negative input end of the differential amplifier via the first transistor while the second memristor is connected to the positive input end of the differential amplifier via the second transistor, the analogue signal or the pulse signal is input to the first memristor and the second memristor through the corresponding function line, so as to obtain a weight value corresponding to the memory cell as the positive weight value.

Accordingly, the present disclosure also provides a chip for in-memory computing, including the multi-mode array structure for in-memory computing.

The present disclosure has the following advantageous effects. The present disclosure discloses a multi-mode array structure for in-memory computing, and a chip, including: an array of memory cells, function lines corresponding to all the memory cells measured by rows in the array of memory cells, and complementary function lines and bit lines BL corresponding to all the memory cells measured by columns in the array of memory cells; as such, the TCAM function and CNN and SNN operations are enabled.

The multi-mode array for in-memory computing herein goes beyond the limits of the von Neumann architecture by integrating the multiple modes of storage and computation, achieves efficient operation and computation; in addition to solving the computing power problem, a new array mode is provided to promote the development of high-integration circuits.

The multi-modal array provided by the present disclosure supports different computation and operation modes of TCAM, CNN, and SNN, satisfies the requirements of different application scenarios, and provides a universal chip capable of supporting TCAM, CNN, and SNN.

According to the present disclosure, a matrix subtraction operation is conducted by setting the conductance of the first memristor and the second memristor and calculating a difference between the conductance of the first memristor and the conductance of the second memristor by the difference amplifier, which expands the computations performed by a conventional neural network that include only matrix multiplication and addition operations; moreover, different from the way in the prior art for a neural network computation to realize the negative weight value through other technical means, the negative weight value can be realized directly in a circuit herein, which enables large-scale parallelism, and the present disclosure features lower power consumption, higher efficiency, and improved accuracy.

DETAILED DESCRIPTION

The embodiments of the present disclosure will be described more fully hereinafter with reference to the accompanying drawings in the detailed description. It is to be understood that the embodiments described herein are some of rather than all possible embodiments of the present disclosure. On the basis of the embodiments of the present disclosure, all other embodiments obtained by a person of ordinary skill in the art without inventive effort shall fall within the scope of the present disclosure.

Figure 1:
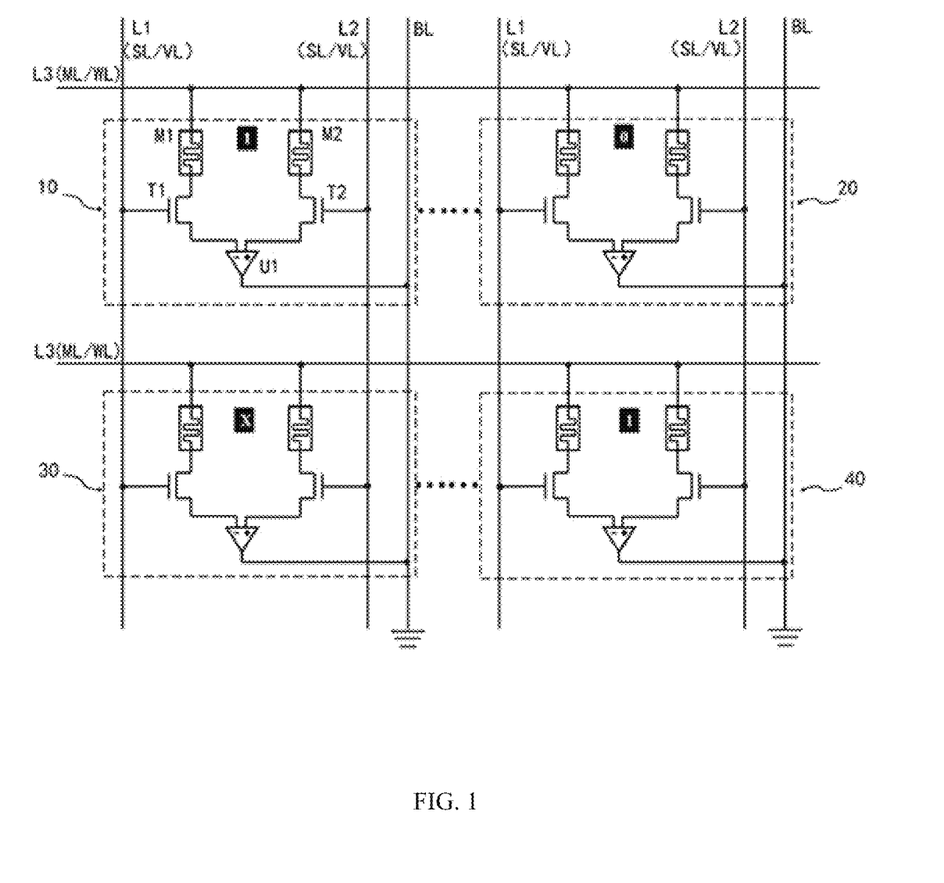
FIG. 1 is a schematic diagram of a multi-mode array structure for in-memory computing according to an embodiment of the present disclosure.

With reference to FIG. 1, this embodiment provides a technical solution as follows. A multi-mode array structure for in-memory computing, including: an array of memory cells, function lines corresponding to all the memory cells measured by rows in the array of memory cells, and complementary function lines and bit lines BL corresponding to all the memory cells measured by columns in the array of memory cells, where the memory cell is configured to match a search state of a search signal input from a corresponding complementary function line with a stored data bit in the memory cell, and output a matching result to the corresponding function line, thereby enabling a TCAM function;

the memory cell is configured to calculate an analogue signal or a pulse signal input from a corresponding function line with a neural network weight value set in the memory cell, and output a calculation result to a corresponding bit line BL, thereby enabling a corresponding CNN or SNN operation.

Specifically, as shown in FIG. 1, the complementary function lines include a first complementary function line L1 and a second complementary function line L2; a first end and a second end of all the memory cells measured by rows in the array of memory cells are connected to one function line L3, third ends of all the memory cells measured by columns in the array of memory cells are connected to one first complementary function line L1, fourth ends of all the memory cells measured by columns in the array of memory cells are connected to one second complementary function line L2, and fifth ends of all the memory cells measured by columns in the array of memory cells are connected to one bit line BL, the bit line BL being connected to a ground terminal.

For example, as shown in FIG. 1, four memory cells are shown, a first memory cell 10 and a second memory cell 20 in one row are connected to a function line L3, and a third memory cell 30 and a fourth memory cell in one row are connected to another function line L3; the first memory cell 10 and the third memory cell 30 in one column are connected to one first complementary function line L1 and are connected to one second complementary function line L2, respectively; the second memory cell 20 and the fourth memory cell 40 in one column are connected to another first complementary function line L1 and are connected to another second complementary function line L2.

It should be noted that in this embodiment, the function line L3 has both the functions of a match line ML and a word line WL; both the first complementary function line L1 and the second complementary function line L2 have both the functions of a search line SL and a control line VL, where the function of the control line VL is specifically to control the on or off of the first transistor T1 and the second transistor T2; the function of the search line SL is specifically to input the search signal to the memory cell; the function of the match line ML is specifically to output a high level or a low level to the outside according to the match result of the memory cell; the function of the word line WL is specifically to input an analog signal or a pulse signal to the memory cell.

In this embodiment, each memory cell includes a first memristor M1, a second memristor M2, a first transistor T1, a second transistor T2, and a differential amplifier U1; a top electrode of the first memristor and a top electrode of the second memristor are connected to the function line; a bottom electrode of the first memristor M1 is connected to a drain electrode of the first transistor T1; a bottom electrode of the second memristor M2 is connected to a drain electrode of the second transistor T2; a gate electrode of the first transistor T1 is connected to the third end of the memory cell; a gate electrode of the second transistor T2 is connected to the fourth end of the memory cell; a source electrode of the first transistor T1 is connected to a first input end of the differential amplifier U1; a source electrode of the second transistor T2 is connected to a second input end of the differential amplifier U1; and output ends of the differential amplifier U1 are connected to the fifth ends of the memory cells, respectively.

Figure 5:
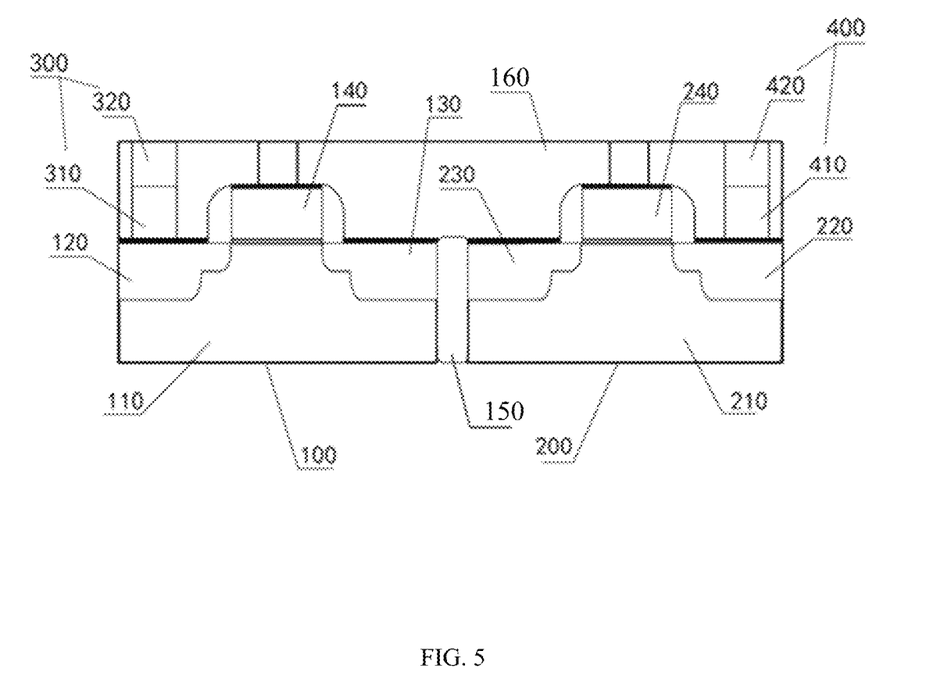

In this embodiment, the first memristor, the second memristor, the first transistor, and the second transistor are prepared through an integrated process, as shown in FIG. 5, the first memristor 300 is provided on a drain electrode 120 surface of the first transistor 100, the second memristor 400 is provided on a drain electrode 220 surface of the second transistor 200, and a shallow trench isolation region 10 is further provided between the first transistor 100 and the second transistor 200, wherein the process for preparing the first memristor, second memristor, first transistor, and second transistor includes:

forming the shallow trench isolation region, and an n-well region corresponding to the first transistor and a p-well region corresponding to the second transistor, respectively, on both sides of the shallow trench isolation region on the basis of a COMS front-end process; forming a gate electrode, a source electrode, and a drain electrode corresponding to the first transistor on a surface of and inside the n-well region, and forming a gate electrode, a source electrode, and a drain electrode corresponding to the second transistor on a surface of and inside the p-well region, so as to obtain the first transistor and the second transistor;

forming a dielectric layer on surfaces of the first transistor and the second transistor, forming a first contact hole perpendicular to the drain electrode surface of the first transistor and a second contact hole perpendicular to the drain electrode surface of the second transistor, respectively, in a dielectric region through an etching process, depositing a first oxide layer and a second oxide layer, respectively, in the first contact hole and the second contact hole, filling the first contact hole and the second contact hole with a metal filler to form a first metal filler layer on a surface of the first oxide layer and a second metal filler layer on a surface of the second oxide layer, so as to obtain a first memristor positioned on the drain electrode surface of the first transistor and containing the first oxide layer and the first metal filler layer, and a second memristor positioned on the drain electrode surface of the second transistor and containing the second oxide layer and the second metal filler layer;

completing the preparation on the basis of a COMS back-end process.

Figure 4:
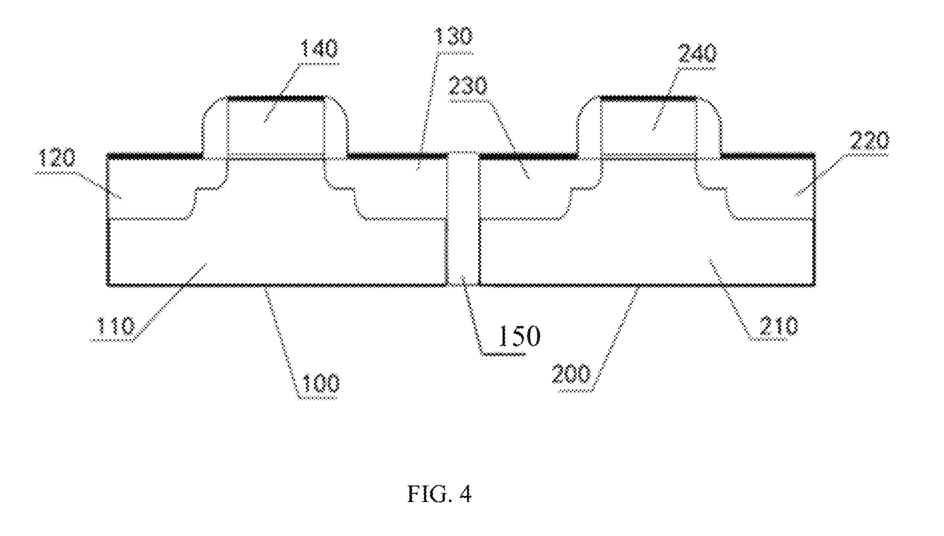
FIGS. 4 and 5 are schematic diagrams of a process for preparing a first memristor, a second memristor, a first transistor, and a second transistor in the multi-mode array structure for in-memory computing according to an embodiment of the present disclosure.

Specifically, at first, a conventional COMS front-end process is performed to form a shallow trench isolation region 150, an n-well region 110, and a p-well region 210 as shown in FIG. 4, and the well regions are subjected to selective implanting and doping, and formation of a gate oxide and a polysilicon gate oxide, respectively, to form a side wall isolation and a light doping, to form a main isolation and a source-drain heavy doping, an active region, and a gate region, and to form a self-aligned polycide, so as to obtain a gate electrode 140, a source electrode 130, and a drain electrode 120 corresponding to the first transistor 100, and a gate electrode 240, a source electrode 230, and a drain electrode 220 corresponding to the second transistor 200.

Next, as shown in FIG. 5, a dielectric layer 160 is formed on the surfaces of the shallow trench isolation region, the first transistor, and the second transistor through CVD deposition of oxynitride silicide, etc., and then a layer of TEOS is deposited for sealing the dielectric layer and a CMP is used for planarization; the dielectric layer is then patterned through a photolithography process to form a contact hole pattern, dielectric regions not covered by a photoresist are removed through dry etching to obtain a vertical contact hole, and finally, only the first contact hole and the second contact hole on the drain electrode surface of the first transistor and the second transistor are exposed through the photolithography process. A layer of oxide is deposited in the first contact hole and the second contact hole, respectively, through magnetron sputtering, where the oxide may be tungsten oxide, silicon dioxide, titanium oxide, etc., so as to obtain a first oxide layer 310 and a second oxide layer 410. The photoresist is removed, and all the contact holes are filled with a metal filler through CVD, where the metal filler may be tungsten deposited to obtain a first metal filler layer 320 and a second metal filler layer 420, resulting in the first memristor 300 positioned on the drain electrode surface of the first transistor and containing the first oxide layer 310 and the first metal filler layer 320 and the second memristor 400 positioned on the drain electrode surface of the second transistor and containing the second oxide layer 410 and the second metal filler layer 420, as shown in FIG. 5.

Finally, the conventional CMOS back-end process is performed, including the steps of forming a metal layer and interconnecting multiple metal layers.

Figure 6:
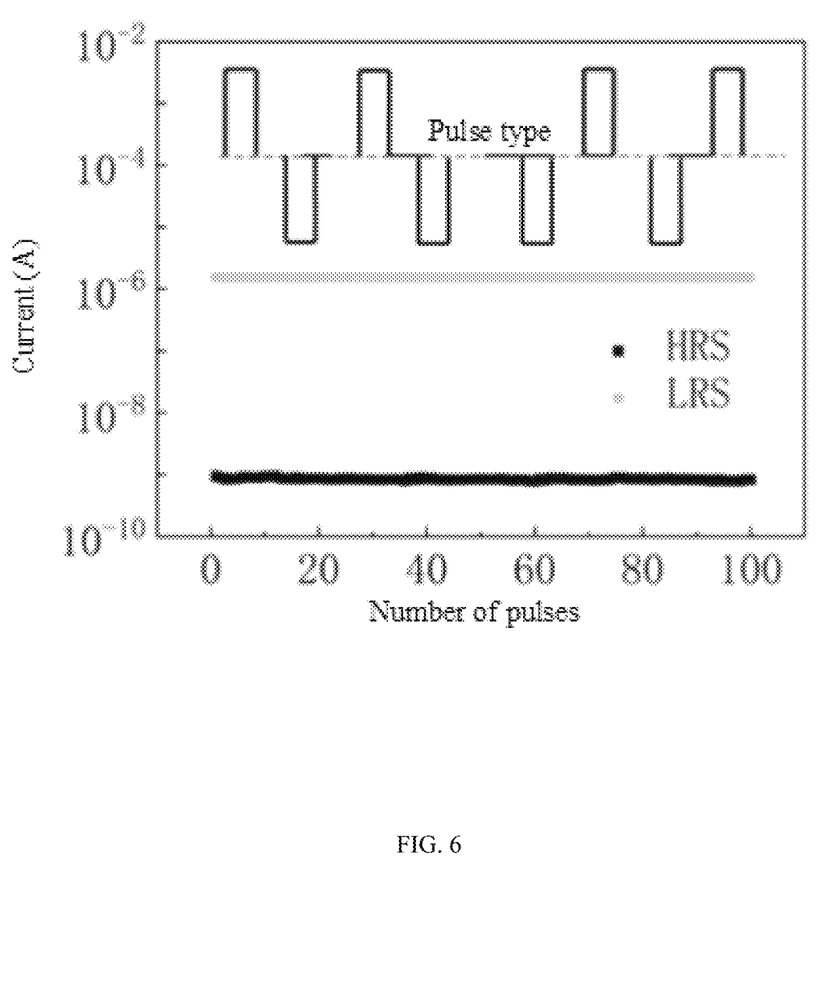
FIG. 6 is a logic state diagram of the first memristor and the second memristor set to a low-resistance state and a high-resistance state, respectively, in the multi-mode array structure for in-memory computing according to an embodiment of the present disclosure.

In this embodiment, the application principle after forming the memristors and transistors through the above process is as explained below. The oxide layer of a memristor accumulates quantitative charges as the voltage across a metal electrode changes, resulting in the oxide layer having a non-volatile resistance value; different resistance values are generated for different quantities of the accumulated charges, so as to set the resistance states of the first memristor and the second memristor to realize the logic states [0], [1], and [X] stored in the memory cell. For example, a high voltage is applied to write the first memristor to a high-resistance state HRS, and a low voltage is applied to write the second memristor to a low-resistance state LRS, and as shown in FIG. 6, a schematic diagram of the two resistance states, i.e., the high-resistance state HRS and the low-resistance state LRS; a turn-on voltage is applied selectively to the gate electrode of the first transistor and the gate electrode of the second transistor so that the first transistor and the second transistor switch between the on and off states, thereby enabling a search function. For example, when the first transistor is turned on and the second transistor is turned off, the memory cell resistance value is R0; when the first transistor is turned off and the second transistor is turned on, the memory cell resistance value is R1; when the first transistor is turned off and the second transistor is turned off, the memory cell resistance value is RX. The three resistance value states enable searching for three logic states, i.e., [0], [1], and [X (arbitrary)], for TCAM array data matching and addressing.

Figure 7:
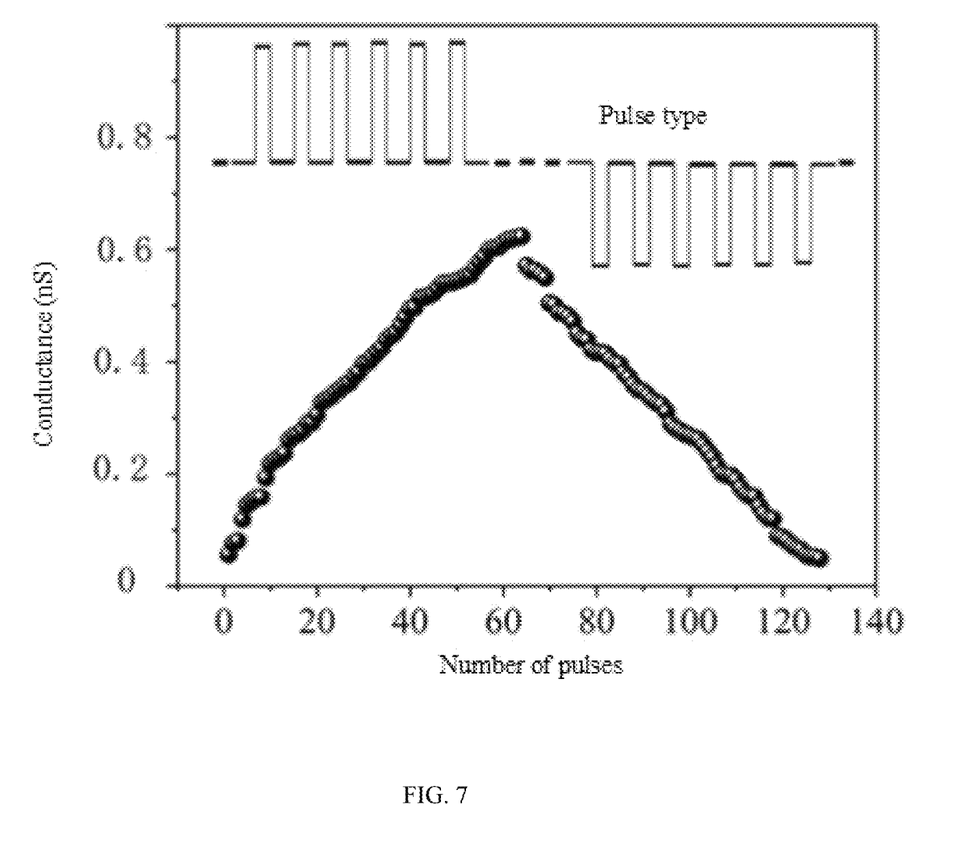
FIG. 7 is a schematic diagram showing a change in conductance after applying an analog voltage signal at top electrodes of the first memristor and the second memristor in the multi-mode array structure for in-memory computing according to an embodiment of the present disclosure.

To perform the CNN/SNN array operation function, it is necessary to apply the turn-on voltage to the gate electrode of the first transistor and the gate electrode of the second transistor so that the first transistor and the second transistor are both in an on state; in addition, it is necessary to apply a voltage to set the conductance values of the first memristor and the second memristor, and at this time, the first memristor and the second memristor are conductivity type memristors in an analogue state, and the conductance values can be changed by respectively applying an analogue voltage signal to the top electrodes of the first memristor and the second memristor, as shown in FIG. 7, a schematic diagram showing the change in conductance value after applying the analogue voltage signal at the top electrodes of the first memristor and the second memristor; finally, analogue synaptic weights are stored according to the change in conductance value of the memory cell, so as to enable the CNN/SNN array operation function.

When the TCAM function is performed, the differential amplifier is in an off state, a corresponding stored data bit in the memory cell is one of 0, 1, and X, and an input search signal corresponds to a search state of being 0 or 1.

When the stored data bit in the memory cell connected to the corresponding function line in all the memory cells measured by rows is X, an output of the corresponding function line is a high level; alternatively, when the stored data bit in the memory cell connected to the corresponding function line in all the memory cells measured by rows is 0 or 1, and the stored data bit is consistent with the search state corresponding to the search signal, the output of the corresponding function line is the high level; when the data bit, connected to the corresponding function line, stored in at least one memory cell in all the memory cells measured by rows is 0 or 1, and the stored data bit is inconsistent with the search state corresponding to the search signal, the output of the corresponding function line is a low level.

Figure 2:
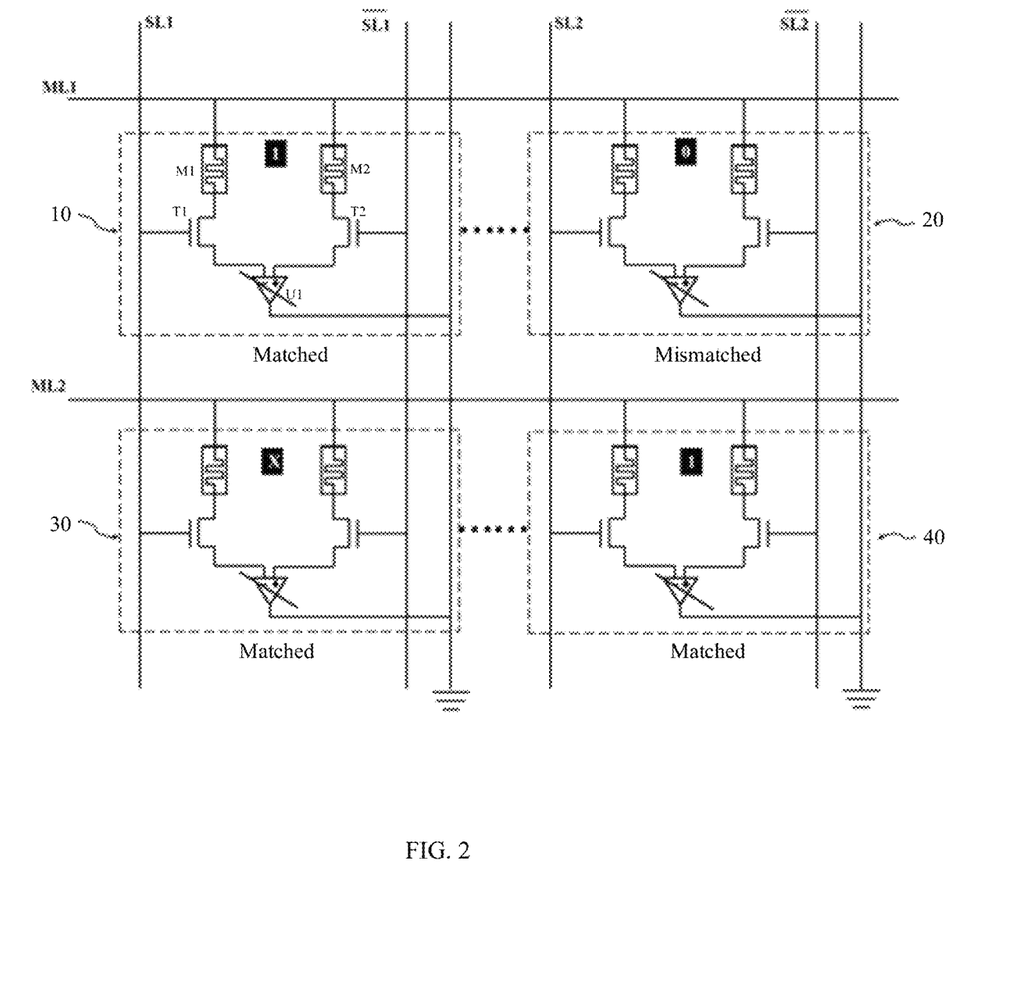
FIG. 2 is a schematic diagram of a multi-mode array structure for in-memory computing enabling a TCAM function according to an embodiment of the present disclosure.

Specifically, when the TCAM function is performed, since the differential amplifier U1 has an enable terminal, when the CNN or SNN operation function is performed, the enable signal is "0", and the differential amplifier function is turned off, as shown in FIG. 2, where the signal is directly connected to the ground terminal, and therefore the differential amplifier can be kept in an off state.

To realize the TCAM function, as a configuration, when the first memristor in the memory cell is set to a high-resistance state and the second memristor is set to a low-resistance state, the corresponding stored data bit is 1; when the first memristor in the memory cell is set to the low-resistance state and the second memristor is set to the high-resistance state, the corresponding stored data bit is 0; when the first memristor in the memory cell is in the high-resistance state and the second memristor is in the high-resistance state, the corresponding stored data bit is X; when the first transistor in the memory cell is controlled in an on state and a second transistor is controlled in an off state, the search state corresponding to an input search signal is 1; when the first transistor in the memory cell is controlled in the off state and the second transistor is controlled in the on state, the search state corresponding to the input search signal is 0.

Specifically, to perform the TCAM function, as shown in FIG. 2, when the stored data bit in the first memory cell 10 and the fourth memory cell 40 is 1, the first memristor M1 in the first memory cell 10 can be defined as in the high-resistance state, and the second memristor M2 is in the low-resistance state opposite thereto; the first memristor M1 in the fourth memory cell 40 is defined as in the high-resistance state, and the second memristor M2 is in the low-resistance state opposite thereto; when the stored data bit in the second memory cell 20 is 0, the first memristor M1 in the second memory cell can be defined as in the low-resistance state, and the corresponding second memristor M2 is in the high-resistance state opposite thereto; when the stored data bit in the third memory cell 30 is X, the first memristor M1 in the third memory cell can be defined as in the high-resistance state, and the second memristor M2 is also in the high-resistance state;

after defining the first memristor and the second memristor, it is also necessary to correspondingly define the search signal according to a rule of correspondence between the state set for the first memristor and the second memristor and the data bit, that is, this embodiment defines that when the first transistor T1 is controlled to be in an off state and the second transistor T2 is controlled to be in an on state, the corresponding search state of the search signal is 1; when the first transistor T1 is controlled to be in an off state and the second transistor T2 is controlled to be in an on state, the corresponding search state of the search signal is 1.

In summary, in the memory cell, a first series structure is formed by connecting the first memristor and the first transistor, and a second series structure is formed by connecting the second memristor and the second transistor; the circuit structure here is such that when the stored data bit matches the search state, or when the stored data bit in the memory cell is X, the resistance value of a parallel connection of the first series structure and the second series structure is large, and the voltage of the corresponding function line maintains a high level; when the stored data bit in the memory cell is not X, and the stored data bit does not match the search state, the resistance value of the parallel connection of the first series structure and the second series structure is small, that is, a high current value is obtained, and the voltage of the corresponding function line is lowered, thereby outputting a low level.

For example, when the stored data bit in the memory cell is 1, the first memristor is in the high-resistance state, that is, the resistance value is high, and the second memristor is in the low-resistance state, that is, the resistance value is low; at this moment, when the search state corresponding to the search signal input into the memory cell is 1, the first transistor is turned on, that is, the resistance value at the first transistor is low, so that the resistance value of a first series circuit composed of the first memristor and the first transistor is high; the second transistor is turned off, that is, the resistance value at the second transistor is high, so that the resistance value of a second series circuit composed of the second memristor and the second transistor is high; as such, the resistance value of a parallel circuit composed of the first series circuit and the second series circuit obtained finally is high, and the current entering the memory cell is small, which means that the voltage signal on the corresponding function line is not lowered, and the output is a high level indicating a successful match. However, when the search state corresponding to the search signal input into the memory cell is 0, the first transistor is turned off, that is, the resistance value at the first transistor is high; the second transistor is turned on, that is, the resistance value at the second transistor is low; as such, the resistance value of the second series circuit composed of the second memristor and the second transistor is low, and the current entering into the memory cell is high, which means that the voltage signal on the function line is lowered, and the function line outputs a low level indicating a match failure. When the stored data bit in the memory cell is X, i.e., arbitrary, whether the search state corresponding to the search signal is 0 or 1 does not affect the level of the function line, indicating that the memory cell is in a matched state, and therefore the function line outputs a high level.

In addition, according to the above principle of configuration, this embodiment also provides another configuration, that is, when the first memristor in the memory cell is set to the low-resistance state and the second memristor is set to the high-resistance state, the corresponding stored data bit is 1; when the first memristor in the memory cell is set to the high-resistance state and the second memristor is set to the low-resistance state, the corresponding stored data bit is 0; when the first memristor in the memory cell is set to the high-resistance state and the second memristor is set to the high-resistance state, the corresponding stored data bit is X; when the first transistor in the memory cell is controlled in the off state and the second transistor is controlled in the on state, the search state corresponding to the input search signal is 1; when the first transistor in the memory cell is controlled in the on state and the second transistor is controlled in the off state, the search state corresponding to the input search signal is 0.

In addition, it should be noted that, in this embodiment, firstly a large voltage is applied to write the high-resistance state or the low-resistance state into the corresponding first memristor or second memristor in the memory cell, and then a small voltage is applied to read a parallel resistance, i.e., a current value, of the memory cell; here, the search takes place during the reading and the voltage for the reading is much smaller than that for the writing, hence during the reading the resistance of the memristor is not changed.

Finally, when the input search signal matches (i.e., is consistent) with the stored data bit, the parallel resistance value of the memory cell is large, that is, the current value is low, and the voltage of the match line remains high, indicating that the search is successful, thereby outputting a high level; when the input search signal does not match (i.e., is not consistent) with the storage state, the parallel resistance value of the memory cell is small, that is, the current value is high, and the voltage of the match line is lowered, indicating that the search signal does not match the stored data bit in the module, thereby outputting a low level; finally, the TCAM function is enabled.

Figure 3:
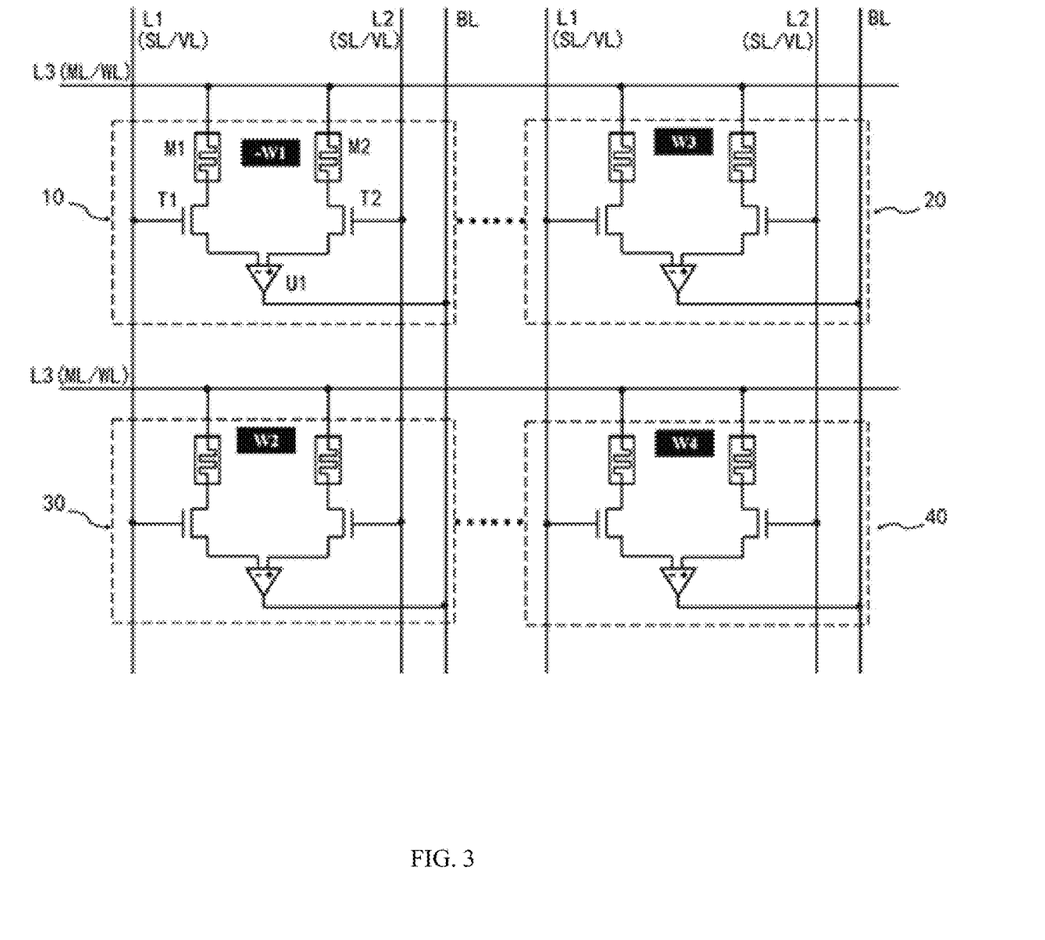
FIG. 3 is a schematic diagram of a multi-mode array structure for in-memory computing enabling a CNN or SNN operation according to an embodiment of the present disclosure.

When the CNN or the SNN operation function is performed, the first transistor, the second transistor, and the differential amplifier are all in the on state; the memory cell is configured to calculate the analogue signal or the pulse signal input from the corresponding function line with a neural network positive or negative weight value set in the memory cell, wherein the memory cell realizes the neural network positive or negative weight value by setting a conductance of the first memristor and the second memristor in the memory cell and setting the first input end of the differential amplifier as a positive input end or a negative input end.

Specifically, since the differential amplifier U1 has an enable terminal, to perform the CNN or SNN operation function, an enable signal "1" is sent, and the differential amplifier function is turned on, thereby controlling the differential amplifier U1 to maintain an on state, as shown in FIG. 3, which is equivalent to the BL bit line failing to be grounded; a control signal is sent via the first complementary function line L1 to control the first transistor T1 to maintain an on state, and a control signal is sent via the second complementary function line L2 to control the second transistor T2 to maintain an on state.

To enable the CNN or SNN operation function, as a configuration, when the conductance of the first memristor in the memory cell is set to be greater than the conductance of the second memristor, and the first memristor is connected to the positive input end of the differential amplifier via the first transistor while the second memristor is connected to the negative input end of the differential amplifier via the second transistor, the analogue signal or the pulse signal is input to the first memristor and the second memristor through the corresponding function line, so as to obtain a weight value corresponding to the memory cell as the positive weight value; when the conductance of the first memristor in the memory cell is set to be less than the conductance of the second memristor, and the first memristor is connected to the positive input end of the differential amplifier via the first transistor while the second memristor is connected to the negative input end of the differential amplifier via the second transistor, the analogue signal or the pulse signal is input to the first memristor and the second memristor through the corresponding function line, so as to obtain a weight value corresponding to the memory cell as the negative weight value.

Specifically, as shown in FIG. 3, when a negative weight value needs to be set in the first memory cell 10, that is, when the weight value is $-W1$, the conductance of the first memristor M1 and the second memristor M2 in the first memory cell 10 can be firstly set such that the conductance of the first memristor M1 is set to be greater than that of the second memristor M2; the first memristor M1 is connected to a negative input end of the differential amplifier U1 via the first transistor T1, and the second memristor M2 is connected to the positive input end of the differential amplifier U1 via the second transistor T2; as such, the weight value in the first memory cell obtained by the differential amplifier U1 is the conductance of the second memristor M2 minus the conductance of the first memristor M1, so as to obtain a negative weight value $-W1$ as the weight value. Finally, this makes the value of the current input to the positive input end of the differential amplifier to be smaller than the value of the current input to the negative input end of the differential amplifier, so as to obtain that the value of the current output from the output end of the differential amplifier to the bit line BL of the first memory cell is $I1=-W1 \times V1$; here, V1 represents a voltage value of the analog signal or the pulse signal input to the first memory cell from the corresponding function line L3.

It can be seen that, according to the present disclosure, a matrix subtraction operation is conducted by setting the conductance of the first memristor and the second memristor and calculating a difference between the conductance of the first memristor and the conductance of the second memristor by the difference amplifier, which is different from the prior art and expands the computations performed by a conventional neural network that include only matrix multiplication and addition operations, whereby the negative weight value can be realized directly in a circuit herein, and large-scale parallelism is enabled; moreover, the present disclosure features lower power consumption, higher efficiency, and improved accuracy.

In addition, when a positive weight value needs to be set in the third memory cell 30 which is connected to the same bit line BL with the first memory cell 10, that is, when the weight value is W2, the conductance of the first memristor M1 and the second memristor M2 in the third memory cell 30 can be firstly set, and the conductance of the first memristor M1 is set to be smaller than that of the second memristor M2. The first memristor M1 is connected to the negative input end of the differential amplifier U1 via the first transistor T1, and the second memristor M2 is connected to the positive input end of the differential amplifier U1 via the second transistor T2. As such, the weight value in the third memory cell is the conductance of the second memristor M2 minus the conductance of the first memristor M1, so as to obtain that the weight value is a positive weight value W2. Finally, this makes the value of the current input to the positive input end of the differential amplifier to be smaller than the value of the current input to the negative input end of the differential amplifier. As a result, the value of the current output from the output end of the differential amplifier to the bit line BL of the third memory cell is I3=W2×V3, herein, V3 represents a voltage value of the analog signal or the pulse signal input to the third memory cell 30 from the corresponding function line L3.

The resulting value of the current output from the corresponding bit line BL is I1+I3=−W1×V1+W2×V3.

As set above, a positive weight value W3 can be set in the second memory cells 30 connected to one bit line BL, and a positive weight value W4 can be set in the fourth memory cell 40, so as to obtain that a value of the current output from the bit line BL connected correspondingly to the second memory cell 30 and the fourth memory cell 40 is I2+I4=W3×V2+W4×V4.

In addition, according to the above principle of calculation, this embodiment also provides another configuration to realize the positive and negative weight values, that is, when the conductance of the first memristor in the memory cell is set to be greater than the conductance of the second memristor, and the first memristor is connected to the negative input end of the differential amplifier via the first transistor while the second memristor is connected to the positive input end of the differential amplifier via the second transistor, the analogue signal or the pulse signal is input to the first memristor and the second memristor through the corresponding function line, so as to obtain a weight value corresponding to the memory cell as the negative weight value; when the conductance of the first memristor in the memory cell is set to be less than the conductance of the second memristor, and the first memristor is connected to the negative input end of the differential amplifier via the first transistor while the second memristor is connected to the positive input end of the differential amplifier via the second transistor, the analogue signal or the pulse signal is input to the first memristor and the second memristor through the corresponding function line, so as to obtain a weight value corresponding to the memory cell as the positive weight value.

The multi-mode array for in-memory computing herein goes beyond the limits of the von Neumann architecture by integrating the multiple modes of storage and computation, achieving efficient operation and computation; in addition to solving the computing power problem, a new array mode is provided to promote the development of high-integration circuits.

Finally, the analogue signal or the pulse signal value is input via the function line, the conductance of the first memristor and the conductance of the second memristor in the memory cell are subjected to subtraction by the differential amplifier to produce the positive weight value or the negative weight value of a neural network, and the output result enables the corresponding CNN or SNN operation through the bit line BL.

The multi-modal array herein supports different computation and operation modes of TCAM, CNN, and SNN, satisfies the requirements of different application scenarios, and provides a universal chip capable of supporting TCAM, CNN, and SNN.

Based on the same inventive concept, embodiments of the present disclosure also provide a chip including the above-described multi-mode array structure for in-memory computing.

Although the present disclosure is described above with reference to preferred embodiments, the present disclosure is not intended to be limited thereto, and any person skilled in the art may employ the method and technical content disclosed above to make possible changes and modifications to the technical solution of the present disclosure without departing from the spirit and scope of the present disclosure. Therefore, any simple modification, equivalent change, and variation of the above embodiments according to the teachings of the present disclosure, not departing from the content of the technical solution of the present disclosure, shall fall within the scope of the technical solution of the present disclosure.

The invention claimed is:

1. A multi-mode array structure for in-memory computing, comprising:
   an array of memory cells, function lines corresponding to all the memory cells measured by rows in the array of memory cells, and complementary function lines and bit lines (BL) corresponding to all the memory cells measured by columns in the array of memory cells, wherein
   the memory cell is configured to match a search state of a search signal input from a corresponding complementary function line with a stored data bit in the memory cell, and output a matching result to the corresponding function line, thereby enabling a ternary content addressable memory (TCAM) function;
   the memory cell is configured to calculate an analogue signal or a pulse signal input from a corresponding function line with a neural network weight value set in the memory cell, and output a calculation result to a corresponding bit line (BL), thereby enabling a corresponding convolutional neural network (CNN) or spiking neural network (SNN) operation;
   when the ternary content addressable memory (TCAM) function is performed, a differential amplifier is in an off state, a corresponding stored data bit in the memory cell is one of 0, 1, and X, and an input search signal corresponds to a search state of being 0 or 1;
   when the stored data bit in the memory cell connected to the corresponding function line in all the memory cells measured by rows is X, an output of the corresponding function line is a higher level; when the stored data bit in the memory cell connected to the corresponding function line in all the memory cells measured by rows is 0 or 1, and the stored data bit is consistent with the search state corresponding to the search signal, the output of the corresponding function line is the higher level; when the data bit, connected to the corresponding function line, stored in at least one memory cell in all the memory cells measured by rows is 0 or 1, and the stored data bit is inconsistent with the search state corresponding to the search signal, the output of the corresponding function line is a lower level.

2. The multi-mode array structure for in-memory computing according to claim 1, wherein the complementary function lines comprise a first complementary function line and a second complementary function line, third ends of all the memory cells measured by columns in the array of memory cells are connected to one first complementary function line, fourth ends of all the memory cells measured by columns in the array of memory cells are connected to one second complementary function line, and fifth ends of all the memory cells measured by columns in the array of memory cells are connected to one bit line (BL), the bit line (BL) being connected to a ground terminal.

3. The multi-mode array structure for in-memory computing according to claim 2, wherein each memory cell comprises a first memristor, a second memristor, a first transistor, a second transistor, and the differential amplifier; a top electrode of the first memristor and a top electrode of the second memristor are connected to the function line; a bottom electrode of the first memristor is connected to a drain electrode of the first transistor; a bottom electrode of the second memristor is connected to a drain electrode of the second transistor; a gate electrode of the first transistor is connected to the third end of the memory cell; a gate electrode of the second transistor is connected to the fourth end of the memory cell; a source electrode of the first transistor is connected to a first input end of the differential amplifier; a source electrode of the second transistor is connected to a second input end of the differential amplifier; and output ends of the differential amplifier are connected to the fifth ends of the memory cells, respectively.

4. The multi-mode array structure for in-memory computing according to claim 3, wherein the first memristor, the second memristor, the first transistor, and the second transistor are prepared through an integrated process, the first memristor is provided on a drain electrode surface of the first transistor, the second memristor is provided on a drain electrode surface of the second transistor, and a shallow trench isolation region is further provided between the first transistor and the second transistor, wherein the process for preparing the first memristor, second memristor, first transistor, and second transistor comprises:
    forming the shallow trench isolation region, and an n-well region corresponding to the first transistor and a p-well region corresponding to the second transistor, respectively, on both sides of the shallow trench isolation region on the basis of a complementary-metal-oxide-semiconductor (CMOS) front-end process; forming a gate electrode, a source electrode, and a drain electrode corresponding to the first transistor on a surface of and inside the n-well region, and forming a gate electrode, a source electrode, and a drain electrode corresponding to the second transistor on a surface of and inside the p-well region, so as to obtain the first transistor and the second transistor;
    forming a dielectric layer on surfaces of the first transistor and the second transistor, forming a first contact hole perpendicular to the drain electrode surface of the first transistor and a second contact hole perpendicular to the drain electrode surface of the second transistor, respectively, in a dielectric region through an etching process, depositing a first oxide layer and a second oxide layer, respectively, in the first contact hole and the second contact hole, filling the first contact hole and the second contact hole with a metal filler to form a first metal filler layer on a surface of the first oxide layer and a second metal filler layer on a surface of the second oxide layer, so as to obtain the first memristor positioned on the drain electrode surface of the first transistor and comprising the first oxide layer and the first metal filler layer, and a second memristor positioned on the drain electrode surface of the second transistor and comprising the second oxide layer and the second metal filler layer; and
    completing the preparation on the basis of a complementary-metal-oxide-semiconductor (CMOS) back-end process.

5. The multi-mode array structure for in-memory computing according to claim 2, wherein the function lines have both functions of a match line (ML) and a word line (WL), and both the first complementary function lines and the second complementary function lines have both functions of a search line (SL) and a control line (VL).

6. The multi-mode array structure for in-memory computing according to claim 3, wherein when the first memristor in the memory cell is set to a higher-resistance state and the second memristor is set to a lower-resistance state, the corresponding stored data bit is 1; when the first memristor in the memory cell is set to the lower-resistance state and the second memristor is set to the higher-resistance state, the corresponding stored data bit is 0; when the first memristor in the memory cell is in the higher-resistance state and the second memristor is in the higher-resistance state, the corresponding stored data bit is X; when the first transistor in the memory cell is controlled in an on state and a second transistor is controlled in an off state, the search state corresponding to an input search signal is 1; when the first transistor in the memory cell is controlled in the off state and the second transistor is controlled in the on state, the search state corresponding to the input search signal is 0;
    when the first memristor in the memory cell is set to the lower-resistance state and the second memristor is set to the higher-resistance state, the corresponding stored data bit is 1; when the first memristor in the memory cell is set to the higher-resistance state and the second memristor is set to the lower-resistance state, the corresponding stored data bit is 0; when the first memristor in the memory cell is set to the higher-resistance state and the second memristor is set to the higher-resistance state, the corresponding stored data bit is X; when the first transistor in the memory cell is controlled in the off state and the second transistor is controlled in the on state, the search state corresponding to the input search signal is 1; when the first transistor in the memory cell is controlled in the on state and the second transistor is controlled in the off state, the search state corresponding to the input search signal is 0.

7. The multi-mode array structure for in-memory computing according to claim 3, wherein when the convolutional neural network (CNN) or the spiking neural network (SNN) operation function is performed, the first transistor, the second transistor, and the differential amplifier are all in the on state; the memory cell is configured to calculate the analogue signal or the pulse signal input from the corresponding function line with a neural network positive or negative weight value set in the memory cell, wherein the memory cell realizes the neural network positive or negative weight value by setting a conductance of the first memristor and the second memristor in the memory cell and setting the first input end of the differential amplifier as a positive input end or a negative input end.

8. The multi-mode array structure for in-memory computing according to claim 7, wherein when the conductance of the first memristor in the memory cell is set to be greater than the conductance of the second memristor, and the first memristor is connected to the positive input end of the differential amplifier via the first transistor while the second memristor is connected to the negative input end of the differential amplifier via the second transistor, the analogue signal or the pulse signal is input to the first memristor and the second memristor through the corresponding function line, so as to obtain a weight value corresponding to the memory cell as the positive weight value; when the conductance of the first memristor in the memory cell is set to be less than the conductance of the second memristor, and the first memristor is connected to the positive input end of the differential amplifier via the first transistor while the second memristor is connected to the negative input end of the differential amplifier via the second transistor, the analogue signal or the pulse signal is input to the first memristor and the second memristor through the corresponding function line, so as to obtain a weight value corresponding to the memory cell as the negative weight value;

when the conductance of the first memristor in the memory cell is set to be greater than the conductance of the second memristor, and the first memristor is connected to the negative input end of the differential amplifier via the first transistor while the second memristor is connected to the positive input end of the differential amplifier via the second transistor, the analogue signal or the pulse signal is input to the first memristor and the second memristor through the corresponding function line, so as to obtain a weight value corresponding to the memory cell as the negative weight value; when the conductance of the first memristor in the memory cell is set to be less than the conductance of the second memristor, and the first memristor is connected to the negative input end of the differential amplifier via the first transistor while the second memristor is connected to the positive input end of the differential amplifier via the second transistor, the analogue signal or the pulse signal is input to the first memristor and the second memristor through the corresponding function line, so as to obtain a weight value corresponding to the memory cell as the positive weight value.

9. A chip for in-memory computing, comprising the multi-mode array structure for in-memory computing according to any one of claims 1 to 8.

* * * * *